United States Patent
Oikawa

(10) Patent No.: US 7,471,551 B2
(45) Date of Patent: Dec. 30, 2008

(54) MAGNETIC MEMORY

(75) Inventor: Tohru Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 20 days.

(21) Appl. No.: 11/802,518

(22) Filed: May 23, 2007

(65) Prior Publication Data

US 2007/0279973 A1 Dec. 6, 2007

(30) Foreign Application Priority Data

May 24, 2006 (JP) .............................. 2006-144530

(51) Int. Cl.
*G11C 11/00* (2006.01)

(52) U.S. Cl. ............................ 365/158; 365/48; 365/50; 365/66; 365/117; 365/130; 365/145; 365/171; 365/173; 257/E21.665; 257/E21.663

(58) Field of Classification Search ................ 365/158, 365/33, 48, 50, 66, 117, 130, 131, 145, 171, 365/173; 257/E21.665, E21.663

See application file for complete search history.

(56) References Cited

OTHER PUBLICATIONS

JP2006-156477, Hugo Yutaka, "Memory Element, and Memory," Jun. 15, 2006, all pages.*
Berger, Luc, "Spin-Wave Emitting Diodes and Spin Diffusion in Magnetic Multilayers," IEEE Transactions on Magnetics, vol. 34, No. 6, pp. 3837-3841 (Nov. 1998).
Slonczewski, J.C., "Current-Driven Excitation of Magnetic Multilayers," Journal of Magnetism and Magnetic Materials, vol. 159, pp. L1-L7 (1996).
Johnson, Mark, "Bipolar Spin Switch," Science, vol. 260, pp. 320-323 (Apr. 1993).

* cited by examiner

*Primary Examiner*—Amir Zarabian
*Assistant Examiner*—Fernando N Hidalgo
(74) *Attorney, Agent, or Firm*—Oliff & Berridge, PLC

(57) ABSTRACT

The direction of magnetization of a reading ferromagnetic material $5_R$ forming a spin filter when reading is the same as that of a pinned layer 1. In this case, a torque that works on the spin of a free layer 3 due to a spin polarized current becomes "zero." When the element size is made small so as to improve the integration degree of the magnetic memory, according to the scaling law, the writing current can be made small. In the present invention, the resistance to the spin injection magnetization reversal due to a reading current is high, so that the magnitude of the writing current can be lowered.

4 Claims, 13 Drawing Sheets

Fig.9

|  | $I_x$ | $S_x$ | $S_z$ | $T_x$ | $T_z$ |
|---|---|---|---|---|---|
| $\sigma_x$ | -1 | 1 | -1 | 1 | -1 |
| $R_y$ | -1 | -1 | -1 | -1 | -1 |
| $R_x$ | 1 | 1 | -1 | 1 | -1 |
| $R_z$ | -1 | -1 | 1 | -1 | 1 |
| $T\sigma_x$ | 1 | -1 | 1 | 1 | -1 |
| $TR_y$ | 1 | 1 | 1 | -1 | -1 |
| $TR_x$ | -1 | -1 | 1 | 1 | -1 |
| $TR_z$ | 1 | 1 | -1 | -1 | 1 |

Fig.10

|  | FIRST EMBODIMENT | SECOND EMBODIMENT | THIRD EMBODIMENT | FOURTH EMBODIMENT |
|---|---|---|---|---|
| WRITING | YES | YES | YES | YES |
| READOUT | NO | NO | NO | NO |

RELATED ART

RELATED ART

RELATED ART

MAGNETIC MEMORY

BACKGROUND OF THE INVENTION

1. Field of the Invention

The present invention relates to a magnetic memory.

2. Related Background Art

An MRAM (magnetic Random Access Memory) has gained attention as a nonvolatile memory. The MRAM is a storage element which stores information by controlling the direction of magnetization of the free layer (magnetosensitive layer), and reads the stored information by measuring the quantity of electrons transmitted through the free layer. Initially, in writing on a storage element, an electric wire is arranged near the storage element, and the direction of magnetization of the free layer is changed by an inductive magnetic field generated by a current supplied into the electric wire. However, writing using an inductive magnetic field easily causes erroneous writing on an adjacent storage element. In this method, magnetic energy diverges into spaces, so that the writing efficiency is low and the writing current is large.

Therefore, a magnetic path is constructed by using a soft magnetic material or the like, and a magnetic field is supplied in a concentrated manner to the storage element through the inside of the magnetic path, whereby the writing efficiency can be improved. However, to drive the soft magnetic material, large energy is necessary, so that it is difficult to greatly increase the writing efficiency.

Therefore, recently, a writing method using spin injection has attracted attention. That is, the direction of magnetization of the free layer can be changed by the spin injection. Magnetization means a state that the direction of electrons spinning are the same in the magnetic material. When electrons spinning in reverse are injected into the inside of the magnetic material, the direction of magnetization inside the magnetic material reverses (spin injection magnetization reversal) according to the injected spin. To cause the spin injection magnetization reversal, it had been generally considered that a comparatively large current is necessary, however, it has been known that magnetization reversal is caused even by a comparatively small current.

As scientific studies in this field, studies described in Non-patent Document 1, Non-patent Document 2, and Non-patent Document 3 are known. In Non-patent Document 1, a device having a plurality of magnetic material layers is described, and torque in the case of a mirror-symmetric structure is discussed. Non-patent Document 2 discloses a spin transistor, however, magnetization reversal in this transistor is performed by using an external magnetic field. Non-patent Document 3 describes a spin torque in a system including two magnetic films laminated via a nonmagnetic film.

Next, a writing method using spin injection will be described.

FIG. 11 is a sectional view of a conventional magnetoresistance effect element (memory element) using spin injection.

The memory element 10 includes a free layer 3, a pinned layer 1 made of a ferromagnetic material, and an intermediate nonmagnetic layer 2 interposed between the free layer 3 and the pinned layer 1. On the surface of the free layer 3 opposite to the intermediate nonmagnetic layer 2, a spin filter formed of a nonmagnetic layer 4 and a ferromagnetic layer 5 is provided.

When writing data, a current flows in a thickness direction of the layers by supplying a bias voltage between the terminal A and the terminal B. By applying a current, spin having a specific polarity of magnetization injected into the inside of the free layer 3 via a spin filter or by being reflected by the spin filter torques the direction of magnetization of the free layer 3, and this direction of magnetization coincides with the polarity of the spin.

At the time of data reading, when the direction of magnetization of the pinned layer 1 and the direction of magnetization of the free layer 3 are parallel to each other, the spin polarized current passing through the intermediate nonmagnetic layer 2 is large, and in this case, for example, "1" is written. When the direction of magnetization of the pinned layer 1 and the direction of magnetization of the free layer 3 are anti-parallel to each other, the spin polarized current that passes through the intermediate nonmagnetic layer 2 is small, and in this case, for example, "0" is written.

Herein, the direction of magnetization of the pinned layer 1 and the direction of magnetization of the ferromagnetic layer 5 are anti-parallel to each other.

FIG. 12 is a circuit diagram of a magnetic memory formed by aligning a plurality of memory elements 10 described above.

When an H level control signal is applied to the word line W1, the transistor Q1 is turned ON, and a current flows from the bit line B1 to the ground via the memory element 10 and the transistor Q1. The potential of the bit line B1 is controlled by the X-coordinate designating circuit 20, and the potential of the word line W1 is controlled by the Y-coordinate designating circuit 30.

At the time of data reading, when the potentials of the word line W1 and the bit line B1 of a specific address are both raised by these circuits, the transistor Q1 is turned ON, and a current corresponding to a resistance value of the memory element 10 positioned at this address flows into the bit line B1. This current is applied to the resistor, and a voltage drop of this resistor is inputted into a comparator, whereby from the comparator, a digital value corresponding to the magnitude of the current, that is, information stored in the memory element 10 is outputted.

At the time of digital value writing, when the potential of the word line W1 of a specific address is raised by the above-described circuit, the transistor Q1 is turned ON, and at this point in time, when the potential of the bit line B1 is greatly raised or lowered, a current flows into the memory element 10 positioned at this address. This current is set to be larger than that for reading. Therefore, spin injection is performed into the inside of the memory element 10, and according to the injected spin polarity, the direction of magnetization of the free layer is determined.

FIG. 13 is a graph showing a relationship between the current I to be supplied to the memory element 10 and the MR ratio (resistance change rate).

In this graph, a hysterisis curve is drawn. As seen in the graph, when a current whose absolute value is not less than a threshold $I_{TH}$ is supplied, the direction of magnetization of the free layer can be reversed. That is, for data writing, a current with a magnitude (not less than $\Delta I_R$ and not more than $\Delta I_W$) which causes spin injection magnetization reversal is supplied to the memory element 10, and for data reading, a current with a magnitude (less than $\Delta I_R$) which does not cause spin injection magnetization reversal is supplied to the memory element 10.

Non-patent Document 1: L. Berger, "Spin-wave emitting diodes and spin diffusion in magnetic multilayers," IEEE Trans. Mag. Vol. 34, Issue 6, pp. 3837-3841, 1998

Non-patent Document 2: M. Johnson, "Bipolar spin switch," Science, Vol. 260, pp. 320-322, 1993

Non-patent Document 3: J. C. Slonczewski, "Current-Driven Excitation of Magnetic Multilayers," Journal of Magnetism and Magnetic Materials, Vol. 159, L1-L7, 1996

SUMMARY OF THE INVENTION

However, in the case of the element structured as described above, for example, the reading current is set to a value 1/10 or less of the writing current, however, measurement of a small current is difficult, so that a current of 0.2 to 0.5 mA or more is necessary when reading. In this case, the writing current must be set to about 5 mA. In the case of the above-described structure, the writing current cannot be made smaller than this value in principle. If the element size is reduced to increase the integration degree, it is possible to lower the writing current, however, the reading current becomes smaller than a detection limit.

The present invention was made in view of these circumstances, and an object thereof is to provide a magnetic memory capable of lowering the magnitude of the writing current.

To solve the above-described problem, a magnetic memory of the invention which includes one or a plurality of storage areas having magnetoresistance effect elements is characterized in that each magnetoresistance effect element including a free layer, a pinned layer made of a ferromagnetic material, an intermediate nonmagnetic layer interposed between the free layer and the pinned layer, a writing ferromagnetic material which has a direction of magnetization the reverse of that of the pinned layer and is provided so that the free layer is positioned within a current path between the same and the pinned layer and a first nonmagnetic layer is positioned within a current path between the same and the free layer, and a reading ferromagnetic material which has a direction of magnetization the same as that of the pinned layer and is provided so that the free layer is positioned within a current path between the same and the pinned layer and a second nonmagnetic layer is positioned within a current path between the same and the free layer.

The magnetoresistance effect element stores digital data according to the relative direction of magnetization of the free layer and the direction of magnetization of the pinned layer. That is, when the direction of magnetization of the pinned layer and the direction of magnetization of the free layer are parallel to each other, the spin polarized current that passes through the intermediate nonmagnetic layer is large, and in this case, for example, "1" is written. When the direction of magnetization of the pinned layer and the direction of magnetization of the free layer are anti-parallel to each other, the spin polarized current that passes through the intermediate nonmagnetic layer is small, and in this case, for example, "0" is written.

In this element, in a current path for writing to supply an injection current into the free layer, the first nonmagnetic layer and the writing ferromagnetic material are positioned. These function as a spin filter and generate a spin polarized current to be injected into the free layer.

In this element, in a current path for reading to supply an injection current into the free layer, the second nonmagnetic layer and the reading ferromagnetic material are positioned. These also function as a spin filter and generate a spin polarized current which passes through the free layer.

Herein, the direction of magnetization of the reading ferromagnetic material forming the spin filter when reading is the same as that of the pinned layer. In this case, the torque that works on the spin of the free layer according to the spin polarized current becomes "zero." That is, even if the reading current is raised, the spin injection magnetization reversal does not occur. In other words, the direction of magnetization of the writing magnetic material forming the spin filter when writing is reverse of that of the pinned layer, and a torque works on the spin of the free layer due to the spin polarized current. Thus, in this element, even if the element size is made small and the magnitude of the writing current is lowered, conventional lowering of the reading current to not more than the detection limit is not necessary, so that the magnitude of the writing current can be lowered.

Even when this element is provided with not only the pinned layer and reading and writing ferromagnetic materials but also other ferromagnetic layers, a structure which does not need lowering of the reading current can be employed.

That is, in the magnetic memory of the present invention, each of the storage areas includes a writing terminal provided on one end of a first current path passing through the free layer, a reading terminal provided on one end of a second current path passing through the free layer, and a common terminal provided on the other end of the first or second current path.

Herein, the layers satisfy the following symmetry conditions.

That is, in the first current path, the number of ferromagnetic materials belonging to a group W (writing) present between the free layer and the writing terminal and the number of ferromagnetic materials belonging to a group C (common) present between the free layer and the common terminal are the same, and the arrangement of the directions of magnetization of the ferromagnetic materials belonging to the group W and the arrangement of the directions of magnetization of the ferromagnetic materials belonging to the group C are anti-parallel to each other when viewed from the free layer.

In the second current path, the number of ferromagnetic materials belonging to a group R (reading) present between the free layer and the reading terminal and the number of ferromagnetic materials belonging to the group C are the same, and the arrangement of the directions of magnetization of the ferromagnetic materials belonging to the group R and the arrangement of the directions of magnetization of the ferromagnetic materials belonging to the group C are the same when viewed from the free layer.

In this case, at the time of data reading, the arrangements of the directions of magnetization of the ferromagnetic layers of the group R and the ferromagnetic layers of the group C are the same when viewed from the free layer, so that the torque that works on the spin of the free layer can be made "zero." On the other hand, at the time of data writing, the arrangements of the directions of magnetization of the ferromagnetic layers of the group W and the ferromagnetic layers of the group C are reverse of each other when viewed from the free layer, so that the spin of the free layer can be effectively torqued.

The pinned layer may have a synthetic structure.

That is, the ferromagnetic materials belonging to the group C are a pinned layer and a first ferromagnetic layer magnetized antiparallel to the pinned layer, and between the first ferromagnetic layer and the pinned layer, a third nonmagnetic layer is interposed. The pinned layer, the first ferromagnetic layer, and the third nonmagnetic layer interposed between the first ferromagnetic layer and the pinned layer form a synthetic structure. In this case, the two ferromagnetic films (pinned layer and the first ferromagnetic layer) are magnetized antiparallel to each other and firmly joined with each other in an antiferromagnetic manner, and the magnetic moments of both ferromagnetic films cancel each other, whereby harmful influence of the magnetostatic effect on the free layer is eliminated or reduced.

When such a synthetic structure is employed, to satisfy the above-described symmetry conditions, the following structure is employed for the spin filter.

That is, the ferromagnetic materials belonging to the group W are a writing ferromagnetic material having a direction of magnetization reverse of that of the pinned layer and a second ferromagnetic layer having a direction of magnetization reverse of that of the first ferromagnetic layer, a fourth nonmagnetic layer is interposed between the writing ferromagnetic material and the second ferromagnetic layer, and the ferromagnetic materials belonging to the group R are a reading ferromagnetic material having the same direction of magnetization as that of the pinned layer and a third ferromagnetic layer having the same direction of magnetization as that of the first ferromagnetic layer, and a fifth nonmagnetic layer is interposed between the reading ferromagnetic material and the third ferromagnetic layer.

That is, to satisfy the above-described symmetry conditions, the direction of magnetization of the first ferromagnetic layer in the synthetic structure is reverse of that of the second ferromagnetic layer when writing, and the fourth nonmagnetic layer is positioned corresponding to the third nonmagnetic layer. Therefore, at the time of writing, a torque works on the spin of the free layer.

On the other hand, the direction of magnetization of the first ferromagnetic layer in the synthetic structure is the same as that of the third ferromagnetic layer at the time of reading, and in terms of symmetry, the fifth nonmagnetic layer is positioned corresponding to the third nonmagnetic layer. Therefore, at the time of writing, the torque that works on the spin of the free layer becomes "zero."

Each of the storage areas includes a semiconductor layer; an insulating layer provided on the semiconductor layer; and the magnetoresistance effect element provided on the insulating layer, the writing terminal is connected to a first bit line via a first semiconductor switch, the reading terminal is connected to a second bit line via a second semiconductor switch, and control terminals of the first and second semiconductor switches are connected to first and second control lines, respectively.

In the case of this structure, a writing current can be supplied to the writing terminal via the first bit line, and a reading current can be supplied to the reading terminal via the second bit line. The flow of the current in each bit line can be controlled by controlling the potentials of first and second control lines connected to control terminals and controlling ON/OFF of first and second semiconductor switches.

According to the magnetic memory of the present invention, the magnitude of the writing current can be lowered.

BRIEF DESCRIPTION OF THE DRAWINGS

FIG. 9 is a table showing a current Ix in the X direction, magnetization Sx in the X direction, magnetization Sz in the Y direction, torque Tx in the X direction, and torque Tz in the Z direction when a symmetric operation is performed;

FIG. 10 is a diagram showing presence of magnetization reversal when 1 mA is applied to a sample;

DESCRIPTION OF THE PREFERRED EMBODIMENTS

Figure 1:
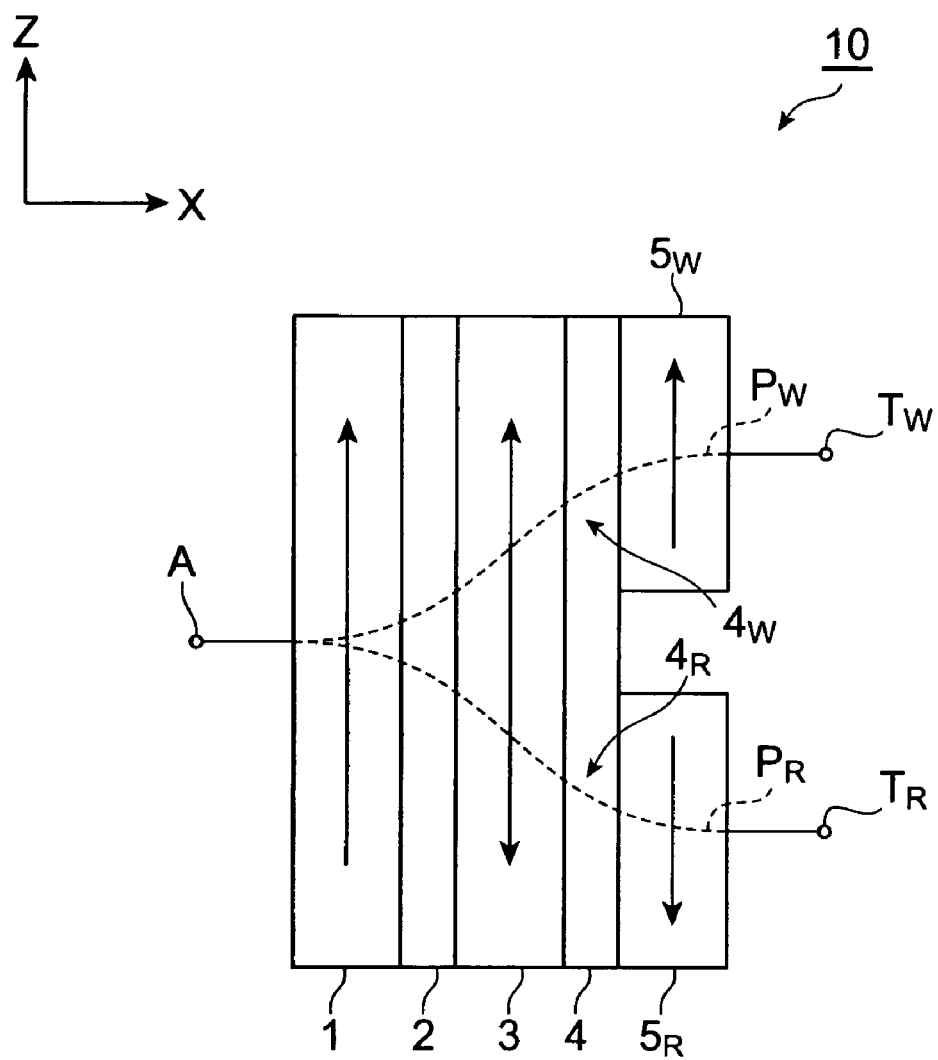
FIG. 1 is a sectional view of a memory element 10 of each storage area.

Hereinafter, a magnetic memory according to an embodiment will be described. For the same components, the same reference numerals are used, and overlapping description will be omitted. The magnetic memory of the embodiment includes one or a plurality of storage areas arranged, and each storage area includes a magnetoresistance effect element (memory element) for storing digital values.

FIG. 1 is a sectional view of the memory element 10 of each storage area.

This memory element 10 includes a free layer 3, a pinned layer 1, and an intermediate nonmagnetic layer 2 in contact with and interposed between the free layer 3 and the pinned layer 1. The surface of the free layer 3 opposite to the intermediate nonmagnetic layer 2 is in contact with a nonmagnetic layer 4, and the surface of the nonmagnetic layer 4 opposite to the free layer 3 is in contact with a writing ferromagnetic material $5_W$ and a reading ferromagnetic material $5_R$. A common terminal $T_C$ is electrically connected to the pinned layer 1, a writing terminal $T_W$ is electrically connected to the writing ferromagnetic material $5_W$, and a reading terminal $T_R$ is electrically connected to the reading ferromagnetic material $5_R$.

In detail, this storage area includes a writing terminal $T_W$ provided on one end of a first current path $P_W$ passing through the free layer 3, a reading terminal $T_R$ provided on one end of a second current path $P_R$ passing through the free layer 3, and a common terminal $T_C$ provided on the other end of the first or second current path.

The attributes of the layers are as follows. The layer thickness direction is defined as X axis direction, and a direction perpendicular to the X axis direction is defined as Z axis direction.

Pinned layer 1: Ferromagnetic material which is fixed in the direction of magnetization to the −Z axis direction, and made of Co, etc.

Intermediate nonmagnetic layer 2: Nonmagnetic insulating layer ($Al_2O_3$ or MgO) with a thickness (several nanometers) that causes a tunnel effect or conductive layer of Cu, etc., to function as a spin filter Free layer 3: Magnetic layer made of a ferromagnetic material having soft magnetic properties and having a direction of magnetization freely rotatable according to injected spin.

Nonmagnetic layer 4: Conductor of Cu or Ru (or insulator with a thickness that causes a tunnel effect)

Writing ferromagnetic material $5_W$: ferromagnetic material fixed in the direction of magnetization to +Z axis direction Reading ferromagnetic material $5_R$: ferromagnetic material fixed in the direction of magnetization to −Z axis direction Ferromagnetism means magnetism of a material in which adjacent spins are directed toward the same direction to generate a great magnetic moment as a whole, and the ferromagnetic material has spontaneous magnetization even when no external magnetic field is applied. Materials which show ferromagnetism at a room temperature include Fe, Co, Ni, and Gd. As the ferromagnetic material, Co, Ni—Fe alloy, and Co—Fe alloy can be preferably used.

The writing ferromagnetic material $5_W$ has a direction of magnetization (+Z) reverse of that of the pinned layer 1, and is provided so that the free layer 3 is positioned in the current path $P_W$ between the writing ferromagnetic material $5_W$ and the pinned layer 1 and the portion (first nonmagnetic layer $4_W$) on the writing side of the nonmagnetic layer 4 is positioned in the current path $P_W$ between the writing ferromagnetic material $5_W$ and the free layer 3.

The reading ferromagnetic material $5_R$ has the same direction of magnetization (−Z) as that of the pinned layer 1, and is provided so that the free layer 3 is positioned in the current path $P_R$ between the reading ferromagnetic material $5_R$ and the pinned layer 1 and the portion (second nonmagnetic layer $4_R$) on the reading side of the nonmagnetic layer 4 is positioned in the current path $P_R$ between the reading ferromagnetic material $5_R$ and the free layer 3.

The memory element 10 stores digital data according to the direction of magnetization of the free layer 3 and the direction of magnetization of the pinned layer 1. That is, when the direction of magnetization of the pinned layer 1 and the direction of magnetization of the free layer 3 are parallel to each other, the spin polarized current which passes through the intermediate nonmagnetic layer 2 becomes larger, and in this case, for example, "1" is written. When the direction of magnetization of the fixed layer 1 and the direction of magnetization of the free layer 3 are anti-parallel to each other, the spin polarized current that passes through the intermediate nonmagnetic layer 2 is small, and in this case, for example, "0" is written.

In the memory element 10, the first nonmagnetic layer $4_W$ and the writing ferromagnetic material $5_W$ are positioned in the current path $P_W$ when writing for supplying an injection current to the free layer 3. These function as a spin filter, and the spin filter transmits specific spin with a predetermined polarity of electrons inputted from the terminal $T_W$ and injects it into the free layer 3 or reflects and injects spin with a reversed polarity of electrons inputted from the terminal $T_C$ into the free layer 3. Thus, the spin filter generates a spin polarized current.

In the memory element 10, in the current path $P_R$ when reading for supplying an injection current to the free layer 3, the second nonmagnetic layer $4_R$ and the reading ferromagnetic material $5_R$ are positioned. These also function as a spin filter and generate a spin polarized current which passes through the free layer 3.

Herein, the direction of magnetization of the reading ferromagnetic material $5_R$ forming the spin filter when reading is the same as that of the pinned layer 1. In this case, the torque that works on the free layer 3 due to the spin polarized current becomes "zero." That is, even if the reading current flowing between the common terminal $T_C$ and the reading terminal $T_R$ is made large, no spin injection magnetization reversal occurs in the free layer 3. In other words, the direction of magnetization of the writing magnetic material $5_W$ forming the spin filter when writing is anti-parallel to the direction of magnetization of the pinned layer 1, and due to the spin polarized current, a torque works on the spin of the free layer 3.

In the above-described memory element 10, to improve the integration degree of the magnetic memory, if the element size is reduced, according to the scaling law, the writing current can be made small, however, the resistance to the spin injection magnetization reversal due to the reading current becomes high, so that it is not necessary to lower the reading current to the detection limit or less according to the writing current as in the conventional case. Therefore, the magnitude of the writing current can be lowered.

Figure 2:
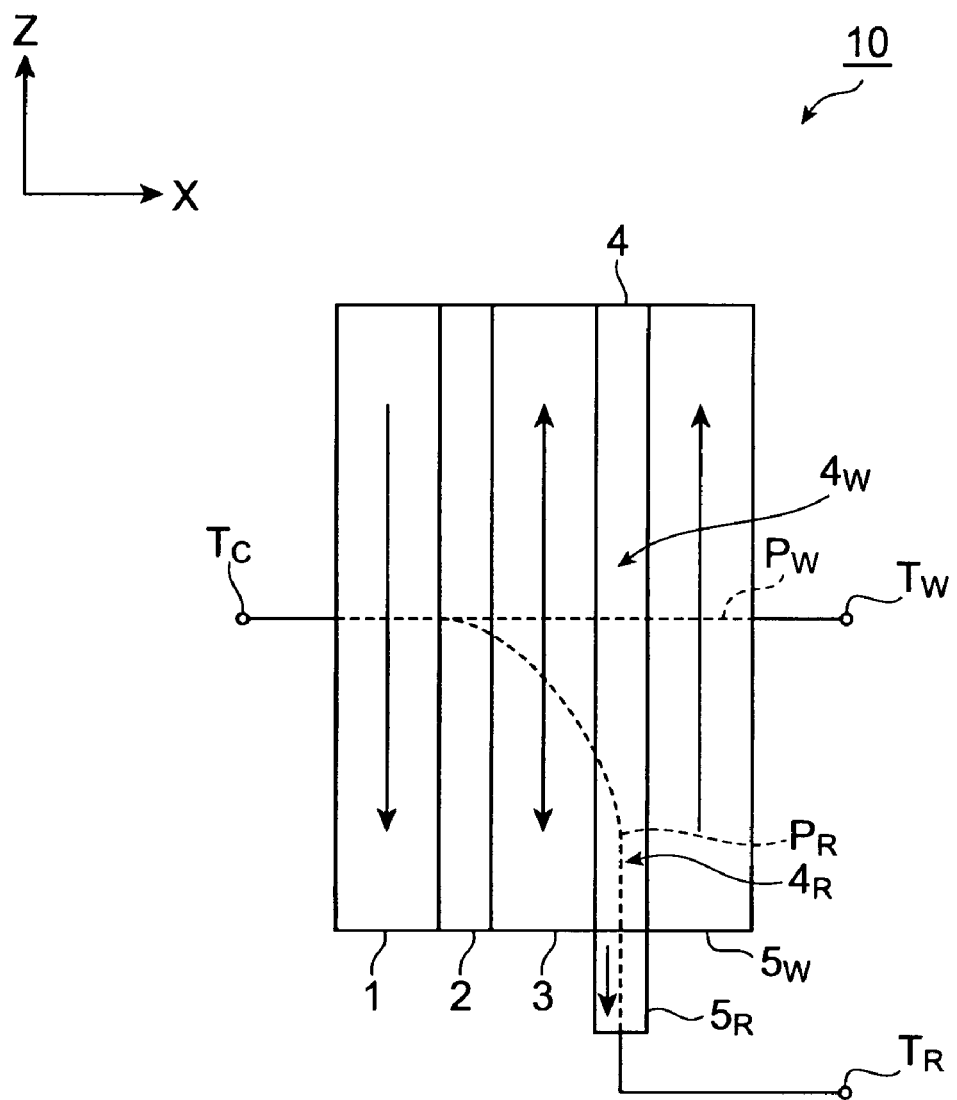
FIG. 2 is a sectional view of a memory element 10 according to another embodiment.

FIG. 2 is a sectional view of a memory element 10 according to another embodiment.

The memory element 10 of this embodiment is different from that of FIG. 1 only in the attaching positions of the writing ferromagnetic material $5_W$ and the reading ferromagnetic material $5_R$, and other structural points are the same. That is, the writing ferromagnetic material $5_W$ is provided in contact with the entire surface of the nonmagnetic layer 4 opposite to the free layer 3, and the reading ferromagnetic material $5_R$ is provided in contact with a side surface perpendicular to this entire surface of the nonmagnetic layer 4. Thus, in this embodiment, only the attaching positions of the writing ferromagnetic material $5_W$ and the reading ferromagnetic material $5_R$ are different, the functions thereof are the same as those described above, and bring about a writing current lowering effect.

In addition, also when the memory element 10 includes not only the pinned layer 1, the writing ferromagnetic material $5_W$ and the reading ferromagnetic material $5_R$ but also other ferromagnetic layers, a structure which does not need lowering of the reading current can be employed.

Next, a memory element having a synthetic structure to suppress the influence on the free layer from the pinned layer 1 will be described.

Figure 3:
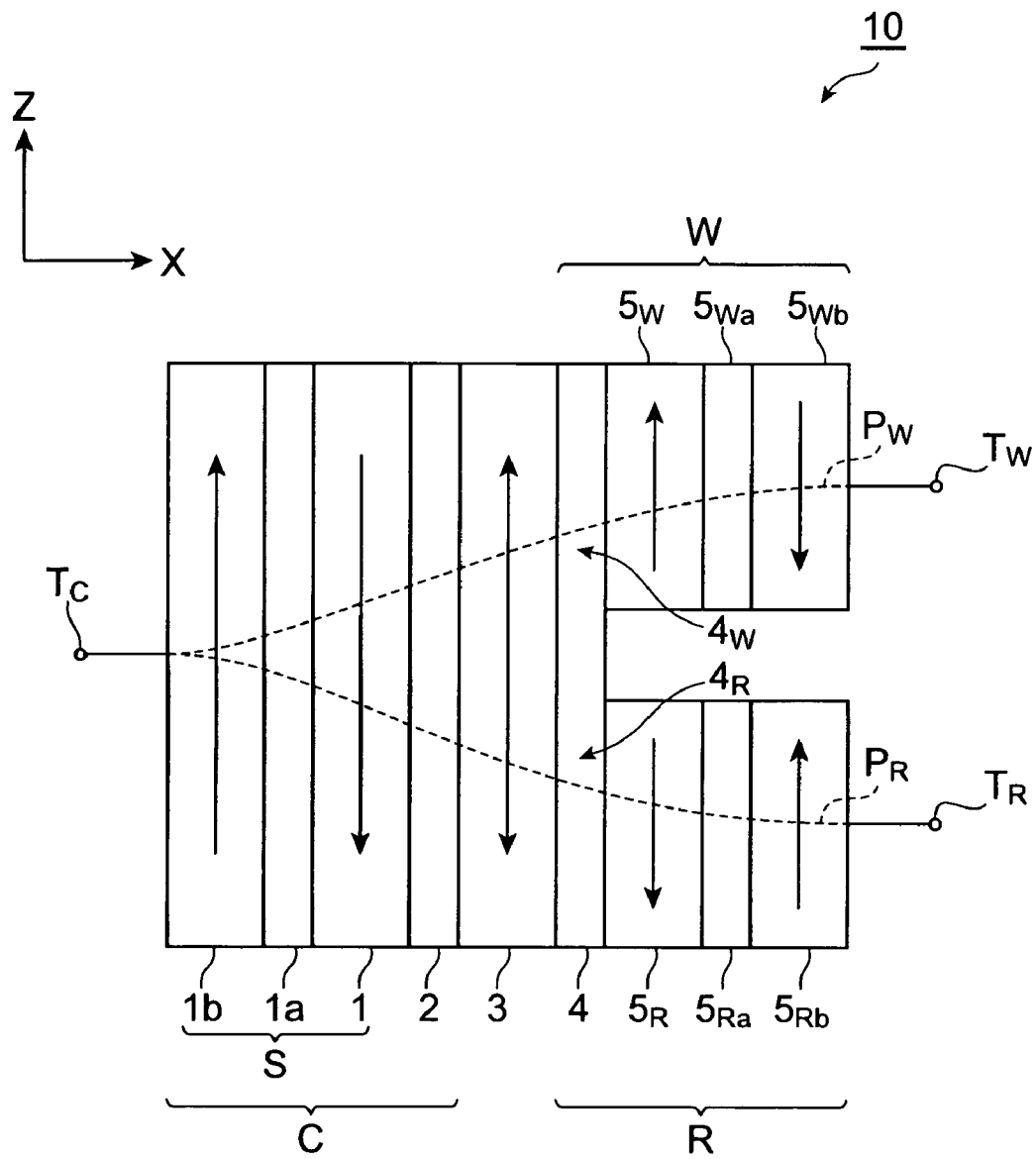
FIG. 3 is a sectional view of a memory element obtained by adding a synthetic pinned layer to the memory element shown in FIG. 1.

FIG. 3 is a sectional view of a memory element obtained by adding a synthetic pinned layer to the memory element shown in FIG. 1. The function of this element is the same as in FIG. 1.

The synthetic pinned layer S includes the above-described pinned layer 1 and a first ferromagnetic layer 1b magnetized antiparallel to the pinned layer 1, and between the first ferromagnetic layer 1b and the pinned layer 1, a third nonmagnetic layer 1a is interposed. In this case, two ferromagnetic films (the pinned layer 1 and the first ferromagnetic layer 1b) are magnetized antiparallel to each other and firmly joined to each other in an antiferromagnetic manner, and the magnetic moments of these ferromagnetic films cancel each other, whereby the harmful influence on the free layer 3 from the magnetostatic effect is eliminated or reduced.

Herein, in the memory element having a plurality of ferromagnetic layers, symmetry which makes the torque zero for spin of the free layer 3 will be described.

When viewed from the free layer 3, the material layer on the common terminal $T_C$ side is defined as group C, the material layer on the writing terminal $T_W$ side is defined as group W, and the material layer on the reading terminal $T_R$ side is defined as group R.

When a synthetic pinned layer is employed, the ferromagnetic materials belonging to the group C are the pinned layer 1 and the first ferromagnetic layer 1b magnetized antiparallel to the pinned layer 1, and between the first ferromagnetic layer 1b and the pinned layer 1, the nonmagnetic layer (third nonmagnetic layer) 1a is interposed.

Herein, the layers satisfy the following symmetry conditions.

That is, in the first current path $P_W$, the number of ferromagnetic materials belonging to the group W (writing) present between the free layer 3 and the writing terminal $T_W$ and the number of ferromagnetic materials belonging to the group C (common) present between the free layer 3 and the common terminal $T_C$ are the same, and the arrangement of directions of magnetization of the ferromagnetic materials belonging to the group W and the arrangement of the directions of magnetization of the ferromagnetic materials belonging to the group C are reverse of each other when viewed from the free layer 3.

In the second current path $P_R$, the number of ferromagnetic materials belonging to the group R (reading) present between the free layer 3 and the reading terminal $T_R$ and the number of ferromagnetic materials belonging to the group C are the same, and the arrangement of the directions of magnetization of the ferromagnetic materials belonging to the group R and the arrangement of the directions of magnetization of the ferromagnetic materials belonging to the group C are the same when viewed from the free layer 3.

In this case, at the time of data reading, the current path $P_R$ is used, and the arrangements of the directions of magnetization of the ferromagnetic layers of the group R and the ferromagnetic layers of the group C are the same and symmetrical when viewed from the free layer, so that the torque that works on the spin of the free layer 3 can be made "zero." On the other hand, at the time of data writing, the current path $P_W$ is used, and the arrangements of the directions of magnetization of the ferromagnetic layers of the group W and the ferromagnetic layers of the group C are reverse (anti-parallel) of each other when viewed from the free layer 3, so that the spin of the free layer can be effectively torqued.

In this example employing the synthetic structure, the ferromagnetic materials belonging to the group W are the writing ferromagnetic material $5_W$ having a direction of magnetization reverse (anti-parallel) of that of the pinned layer 1 and the second ferromagnetic layer $5_{Wb}$ having a direction of magnetization reverse (anti-parallel) of that of the first ferromagnetic layer 1b, and between the writing ferromagnetic material $5_W$ and the second ferromagnetic layer $5_{Wb}$, a fourth nonmagnetic layer $5_{Wa}$ is interposed.

The ferromagnetic materials belonging to the group R are the reading ferromagnetic material $5_R$ having the same direction of magnetization as that of the pinned layer 1 and the third ferromagnetic layer $5_{Rb}$ having the same direction of magnetization as that of the first ferromagnetic layer 1b, and between the reading ferromagnetic material $5_R$ and the third ferromagnetic layer $5_{Rb}$, a fifth nonmagnetic layer $5_{Ra}$ is interposed.

In this case, the above-described symmetry conditions are satisfied. That is, the direction of magnetization (+Z) of the first ferromagnetic layer 1b in the synthetic structure is anti-parallel to that (−Z) of the second ferromagnetic layer $5_{Wb}$ at the time of writing, and the fourth nonmagnetic layer $5_{Wa}$ is positioned corresponding to the third nonmagnetic layer 1a. Therefore, at the time of writing, a torque works on the spin of the free layer 3.

On the other hand, at the time of reading, the direction of magnetization of the first ferromagnetic layer 1b in the synthetic structure is the same as that of the third ferromagnetic layer $5_{Rb}$, and in terms of symmetry, the fifth nonmagnetic layer $5_{Ra}$ is positioned corresponding to the third nonmagnetic layer 1a. Therefore, at the time of writing, the torque that works on the spin of the free layer 3 becomes "zero."

Figure 4:
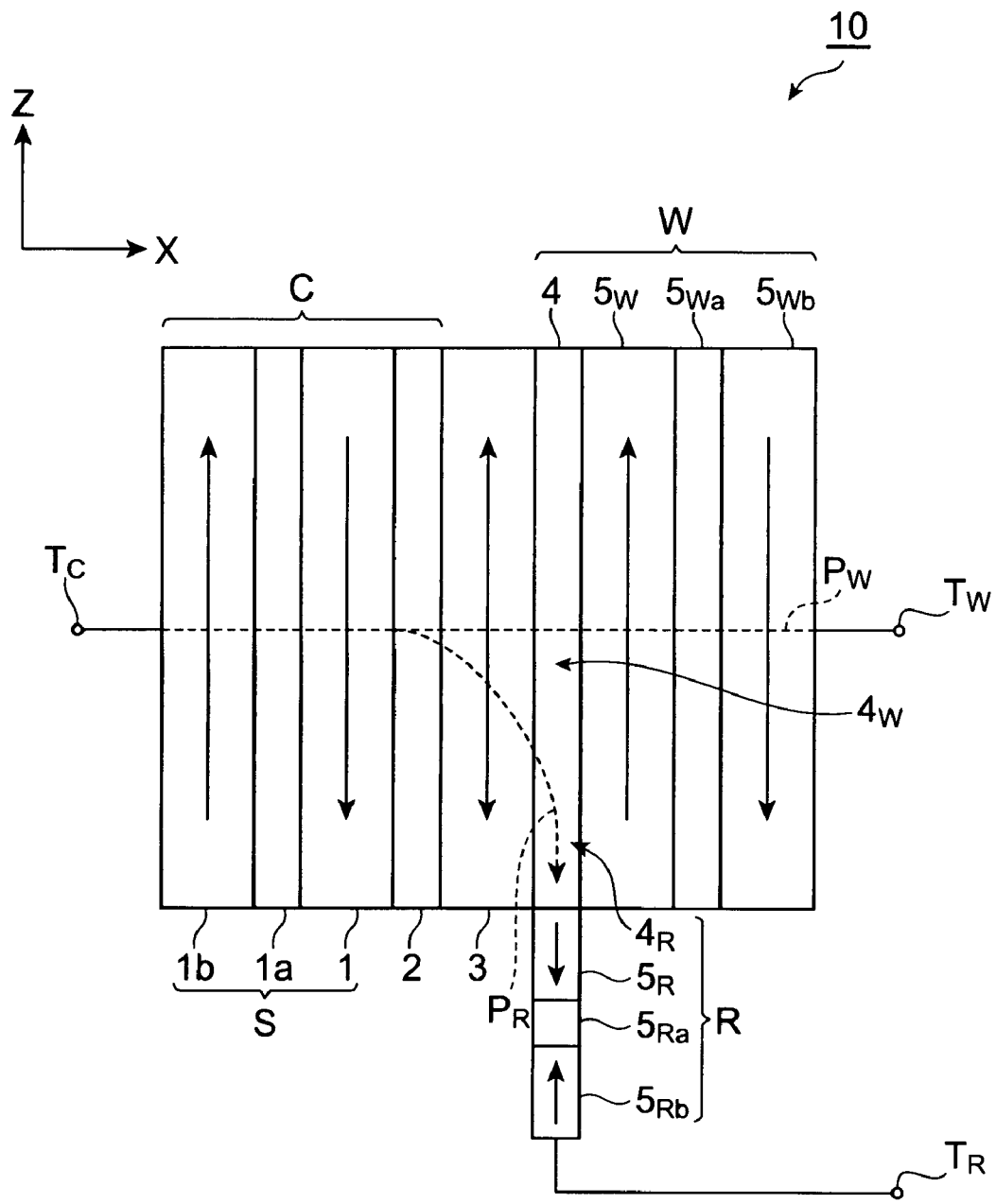
FIG. 4 is a sectional view of a memory element 10 according to another embodiment.

FIG. 4 is a sectional view of a memory element 10 according to another embodiment.

The memory element 10 of this embodiment is different from that shown in FIG. 3 in only the attaching positions of the material layers of the group W and the material layers of the group R, and other structural points are the same. That is, the writing ferromagnetic material $5_W$ is provided in contact with the entire surface of the nonmagnetic layer 4 opposite to the free layer 3, and the reading ferromagnetic material $5_R$ is provided in contact with a side surface of the nonmagnetic layer 4 perpendicular to said entire surface.

Furthermore, the nonmagnetic layer $5_{Wa}$ of the group W is in contact with the surface of the writing ferromagnetic material $5_W$ opposite to the nonmagnetic layer 4, and the ferromagnetic layer $5_{Wb}$ is in contact with the surface of the nonmagnetic layer $5_{Wa}$ opposite to the writing ferromagnetic material $5_W$. The nonmagnetic layer $5_{Ra}$ of the group R is in contact with the surface of the reading ferromagnetic material $5_R$ opposite to the interface with the nonmagnetic layer 4, and the ferromagnetic layer $5_{Rb}$ is in contact with the surface of the nonmagnetic layer $5_{Ra}$ opposite to the reading ferromagnetic material $5_R$.

Thus, in this example, only the attaching positions of the material layers of the group W and the material layers of the group R are different, and the function is the same as that described above, so that an effect of lowering the writing current is brought about.

Figure 5:
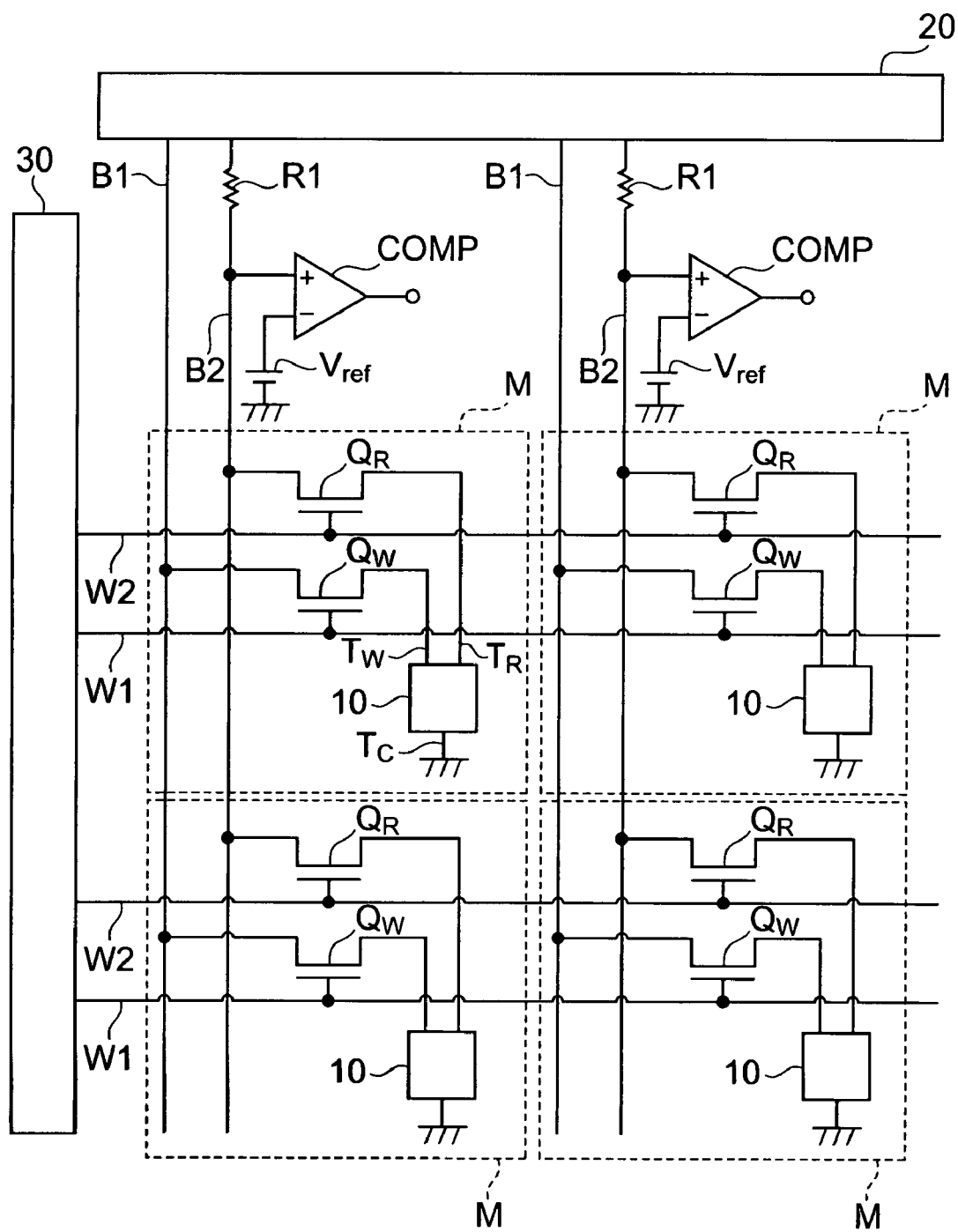
FIG. 5 is a circuit diagram of a magnetic memory.

FIG. 5 is a circuit diagram of a magnetic memory.

The magnetic memory includes one or a plurality of storage areas M. Each storage area M includes the above-described memory element 10, and the writing terminal $T_W$ is connected to a first bit line B1 via a first semiconductor switch (transistor) $Q_W$, and the reading terminal $T_R$ is connected to a second bit line B2 via a second semiconductor switch (transistor) $Q_R$. The control terminals (gates) of the transistors $Q_W$ and $Q_R$ are connected to a first control line (word line) W1 and a second control line (word line) W2, respectively.

In this structure, a writing current can be supplied to the writing terminal $T_W$ via the first bit line B1, and a reading current can be supplied to the reading terminal $T_R$ via the second bit line B2. The presence of a current flowing in each bit line can be controlled by controlling the potentials of the word lines W1 and W2 connected to the control terminals and controlling ON/OFF of the transistors $Q_W$ and $Q_R$.

When an H level control signal is supplied to the word line W1, each transistor $Q_W$ is turned ON, and a current flows into the memory element 10 from the bit line B1 via the transistor $Q_W$ and the writing terminal $T_W$, and this current flows to the ground via the common terminal $T_C$. The potential of the word line W1 is controlled by the Y-coordinate designating circuit 30 by controlling the potential of the bit line B1 by the X-coordinate designating circuit 20.

At the time of writing of a digital value, when the potential of the word line W1 of a specific address is raised by the X-coordinate designating circuit 20 and the Y-coordinate designating circuit 30, the transistor $Q_W$ is turned ON, and at this time, by greatly raising or lowering the potential of the bit line B1, a current flows into the memory element 10 positioned at this address via the writing terminal $T_W$. Therefore, spin injection is performed inside the memory element 10, and according to the injected spin polarity, the direction of magnetization of the free layer 3 is determined.

At the time of data reading, when the potentials of the word line W2 and the bit line B2 of a specific address are both raised by the X-coordinate designating circuit 20 and the Y-coordinate designating circuit 30, the transistor $Q_R$ is turned ON, and a current corresponding to the resistance value of the memory element 10 positioned at this address flows into the bit line B2 via the reading terminal $T_R$. This current is supplied to a resistor R1 directly connected to the bit line B2, and a voltage drop of this resistor R1 is inputted into a comparator COMP which compares it with a reference potential Vref, whereby a digital value corresponding to the current, that is, information stored in the memory element 10 is outputted from the comparator COMP.

Figure 6:
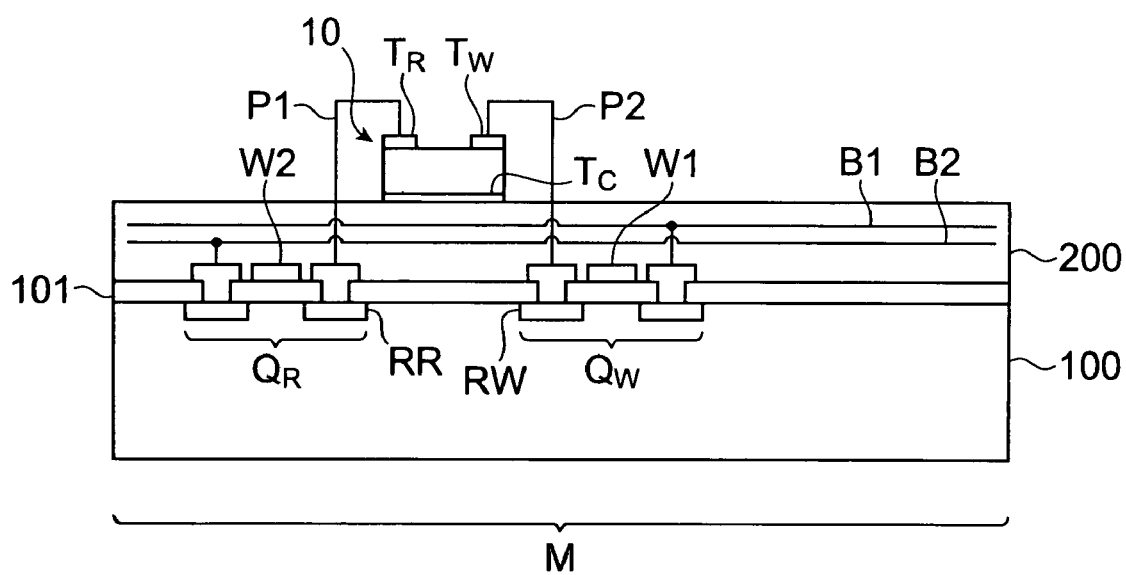
FIG. 6 is a sectional view of a storage area M.

FIG. 6 is a sectional view of the storage area M.

This storage area M includes a semiconductor layer 100, a insulating layer 200 provided on the semiconductor layer 100, and a memory element 10 provided on the insulating layer 200. In the semiconductor layer 100, MOS transistors $Q_R$ and $Q_W$ are formed, and these gates are formed on an $SiO_2$ layer 101 provided on the semiconductor layer 100 and commonly serve as the word lines W2 and W1. The bit lines B1 and B2 are embedded in the insulating layer 200. From the drains (or source areas RR and RW) of the transistors $Q_R$ and $Q_W$, vertical electrodes P1 and P2 penetrating the inside of the insulating layer 200 extend along the thickness direction of the insulating layer 200, and the vertical electrodes P1 and P2 are electrically connected to the terminals $T_R$ and $T_W$ of the memory element 10, respectively.

Next, brief supplementary explanation will be given about the principle of the above-described symmetry.

The present invention uses a torque of multilayer films, however, the precise theory applicable to multilayer films is not conventionally known. The present invention was made by applying group theory to laminated film structures, and only symmetry is used, so that the present invention was made based on general conclusions without depending on the details of the theory by experimentally confirming it.

Figure 7A:
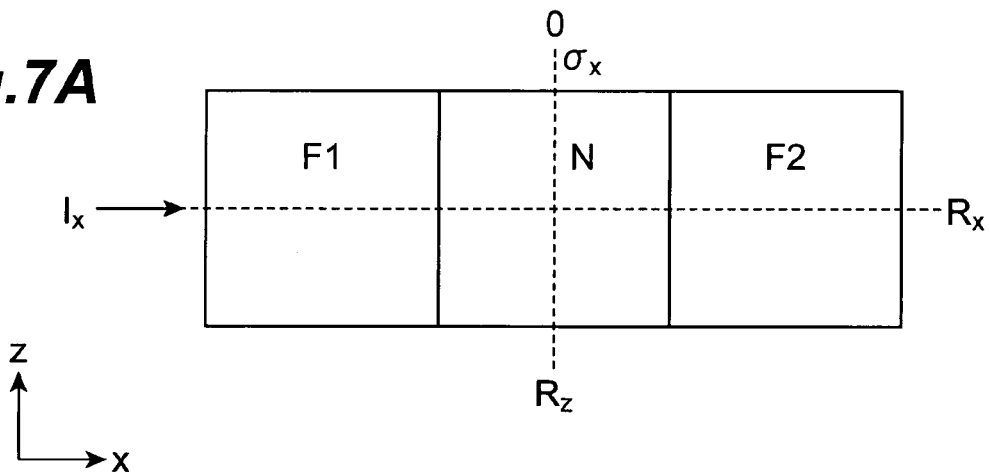
FIGS. 7A, 7B, 7C, 7D and 7E are diagrams showing an element having two ferromagnetic films.

FIGS. 7A to 7E are diagrams showing an element having two ferromagnetic films. FIGS. 8A to 8C are diagrams showing an element having three ferromagnetic films.

F1, F2, and F3 denote ferromagnetic materials, and N, N1, and N2 denote nonmagnetic conductors. As shown in FIG. 7A, the ferromagnetic materials F1 and F2 are arranged symmetrically with respect to the nonmagnetic material N as a lamination center. In FIG. 8A, the ferromagnetic materials F1 and F3 and the nonmagnetic materials N1 and N2 are arranged symmetrically with respect to the ferromagnetic material F2 as a lamination center. Two ferromagnetic materials are shown in FIGS. 7A to 7E and three ferromagnetic materials are shown in FIGS. 8A to 8C, however, these numbers of ferromagnetic materials may be arbitrary even number or odd number. The films symmetrical to each other are equal in thickness, composition, and magnetic anisotropy. The relationship of spin torques that work on surfaces facing each other across the central axis 0 is generally investigated by using symmetry.

In FIG. 7A and FIG. 8A, the coordinate system is defined by setting the lamination direction as X and the in-plane magnetization easy axis as Z. The magnetization vector rotates within the XZ plane. When magnetization reverses from the Z direction to the (−Z) direction, it rotates around the Z axis due to precession, however, it is proved by the LLG (Landau-Lifshitz-Gilbert) equation that the magnetization reversal may be handled by stopping the precession at an arbitrary angle, so that it is assumed here that reversal occurs within the ZX plane to prevent loss of generality. A mirror symmetric operation at the position of the central film surface is defined as σx. Rx, Ry, and Rz denote rotation symmetric operations around X, Y, and Z axes, respectively, and T denotes a time reversal operation. TRx, TRy, and TRz are time reversal operations after the rotation symmetric operations (rotation by 180 degrees) Rx, Ry, and Rz are performed, respectively. In consideration of physics phenomena, magnetization and current invariance must be simultaneously satisfied.

FIG. 9 shows a current Ix in the X direction, magnetization Sx in the X direction, magnetization Sz in the Y direction, a torque Tx in the X direction, and a torque Tz in the Z direction when the symmetric operations are performed. The reason for a difference in conversion properties of these parameters is that the current is a time reversal odd vector, the magnetization is a time reversal odd pseudovector, and the torque is a time reversal even pseudovector. When the parameter reverses, it becomes negative. Due to one-dimensional expression, the conversion results in only addition of a plus sign or a minus sign. The correct symmetric operation results in Ix invariable, and in the case of three-layer lamination, Sx and Sz invariable.

In FIG. 9, Rx does not provide information on the surfaces facing each other, so that it is excluded. In conclusion, Tσx and TRx are applied in the two-layer lamination, and TRy with invariable Sx and Sz is applied in the three-layer lamination.

Figure 7B:
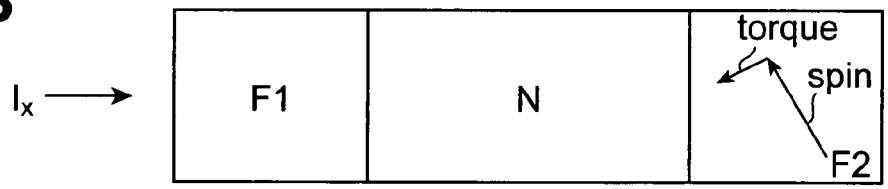
Figure 7C:
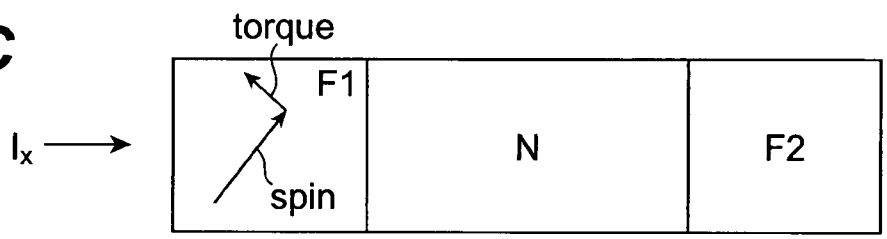
Figure 7D:
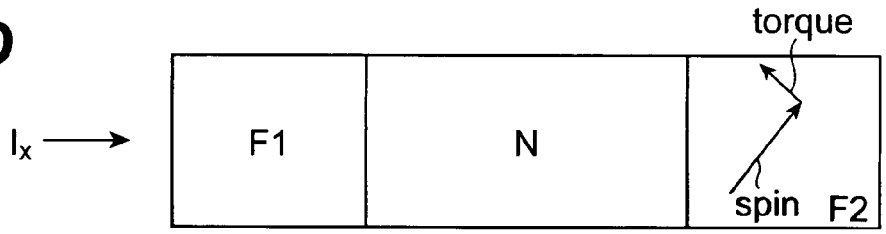
Figure 7E:
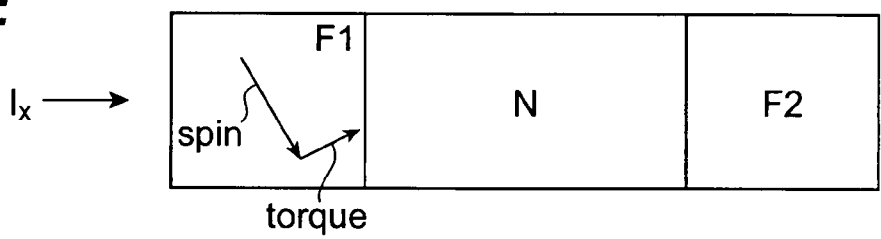
Figure 8A:
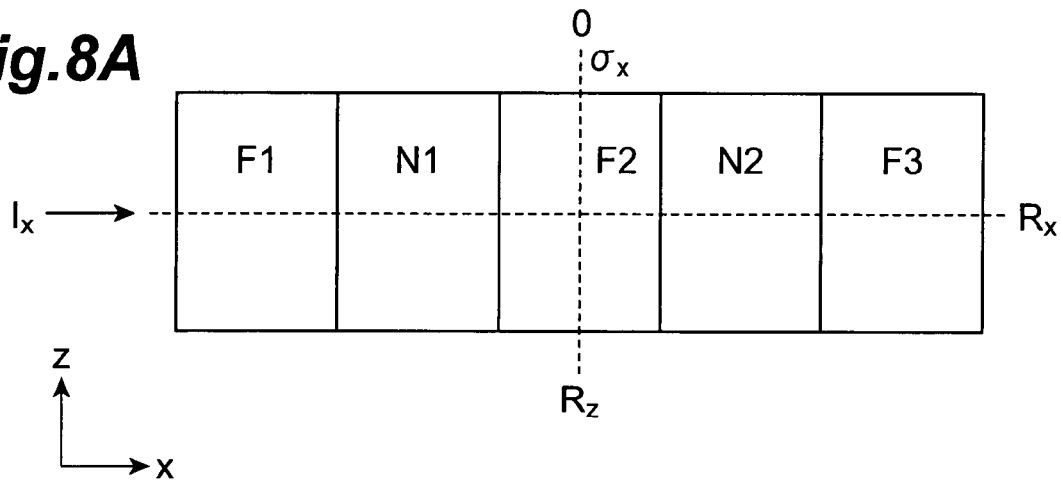
FIGS. 8A, 8B and 8C are diagrams showing an element having three ferromagnetic films.
Figure 8B:
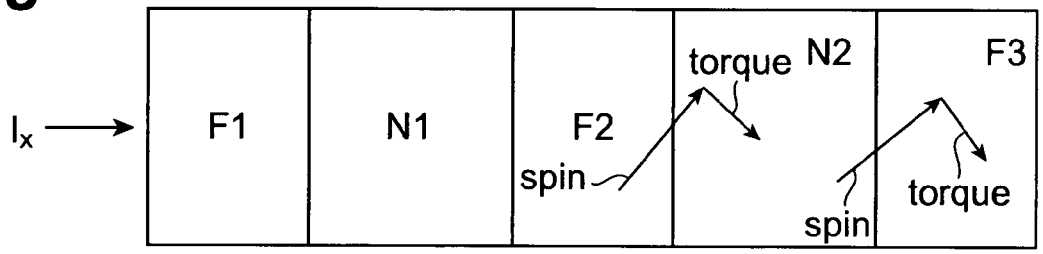
Figure 8C:
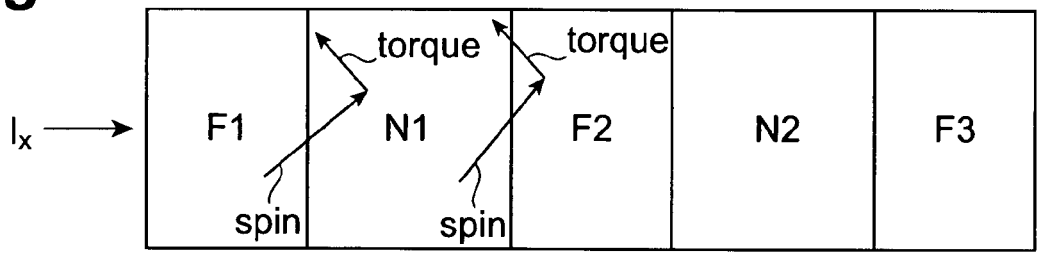

As shown in FIG. 7B, when the current Ix is supplied, a torque works on the spin inside the ferromagnetic material F2. When a symmetric operation Tσx is applied thereto, as shown in FIG. 7C, a torque with the same magnitude in the same direction (counterclockwise rotation) works on the spin of the equivalent ferromagnetic material F1. As show in FIG. 7E, when the symmetric operation TRz is applied in FIG. 7D, a torque with the same magnitude in the same direction (clockwise) works on the equivalent ferromagnetic material F1. The results shown in FIG. 7B through FIG. 7E are consistent with the Slonczewski's theory.

When the symmetric operation TRy is applied in FIG. 8B, as shown in FIG. 8C, when the spins of the ferromagnetic materials F1 and F3 are parallel to each other, a torque with the same magnitude in a reverse direction works on the central ferromagnetic material F2. This principle was found for the first time.

The present invention utilizes the phenomenon that, if the spins of layers facing each other are set parallel to each other, the torques cancel each other in the central film (ferromagnetic material F2). That is, when the central film F2 in FIGS. 8A to 8C is a free layer, magnetization of a layer mirror-symmetric to the free layer is made parallel, whereby the torque of the free layer can be made zero. This principle is applicable to a magnetic multilayer film including an arbitrary odd-number of layers. Furthermore, this principle does not depend on the materials of the magnetic layer and non-magnetic layer. The nonmagnetic layers N1 and N2 may be metal films of Cu or the like or insulating tunnel films of alumina or MgO.

Figure 11:
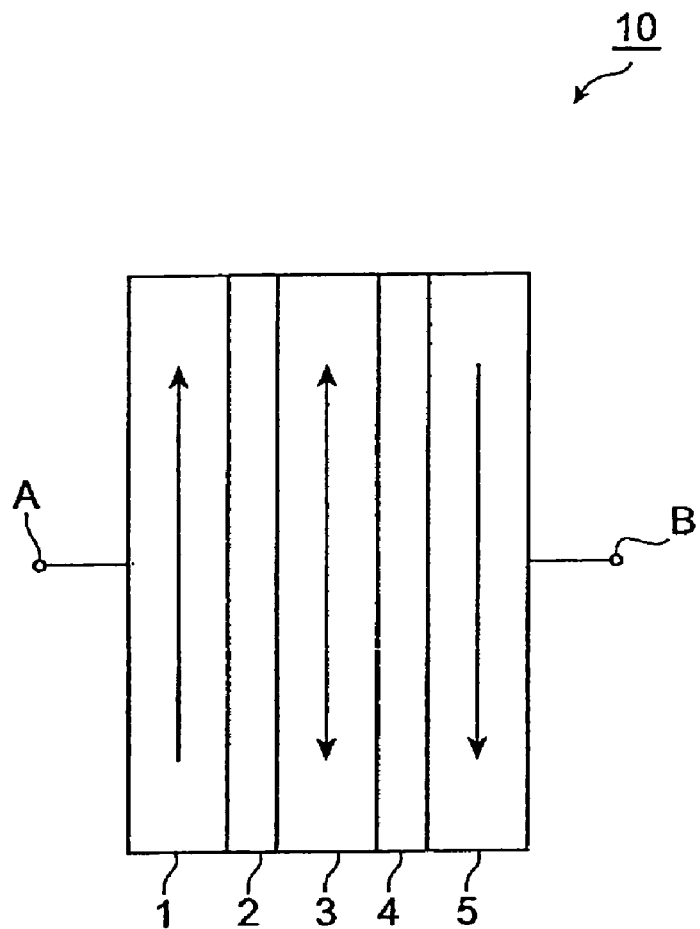
FIG. 11 is a sectional view of a conventional magnetoresistance effect element (memory element) using spin injection.
Figure 12:
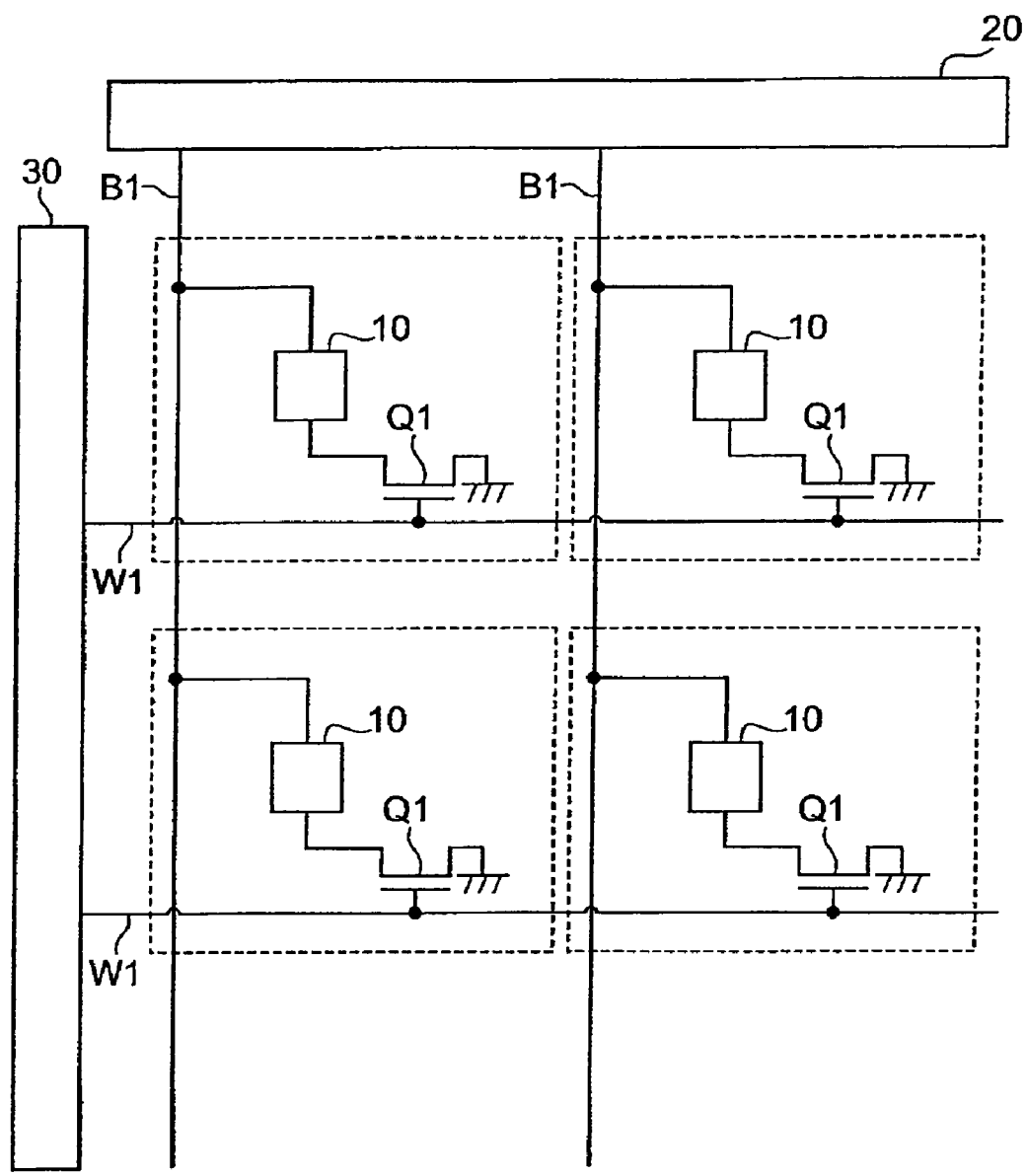
FIG. 12 is a circuit diagram of a magnetic memory obtained by aligning a plurality of memory elements 10 described above.

Herein, considering spin injection magnetization reversal in the layer structure model of FIG. 11, in the case where the direction of magnetization of the filter layer (ferromagnetic material 5) is different from that of the pinned layer 1, when a current Ix is supplied, a torque works on the spin of the free layer 3, and the direction of magnetization reverses. However, when the direction of magnetization of the filter layer (ferromagnetic material 5) and the direction of magnetization of the pinned layer 1 are the same, the torques cancel each other, so that the direction of magnetization does not reverse.

This phenomenon occurs not only in the three-layer structure shown in FIG. 1 but also in other mirror structures as long as the mirror structure uses the free layer 3 as an axis of symmetry. If the structure is mirror symmetric, including the directions of magnetization, no torque is generated in the free layer 3, so that magnetization does not reverse. However, even when the layer structure is symmetric, if the orientation of the axis is in reverse, a torque is generated and the magnetization reverses.

Figure 13:
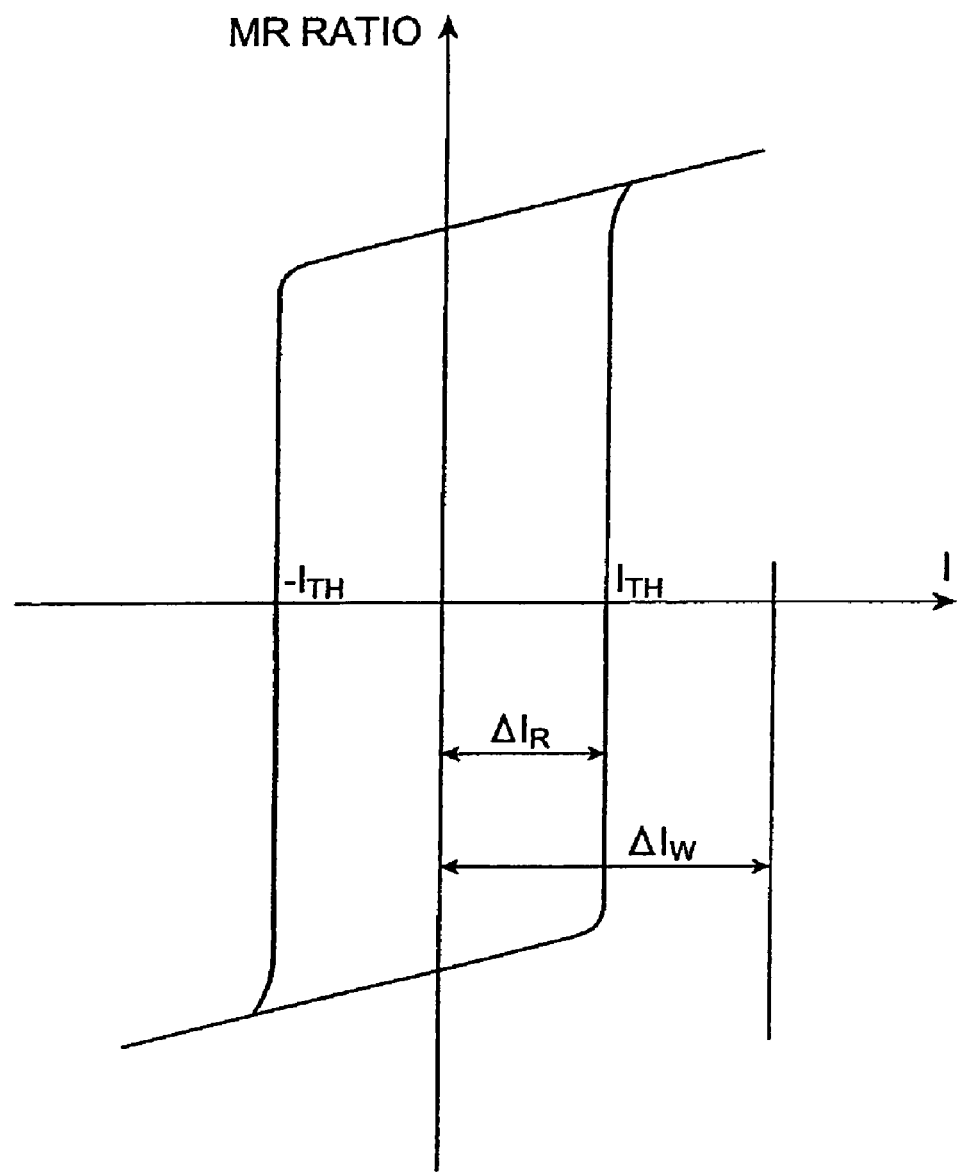
FIG. 13 is a graph showing the relationship between a current I to be supplied to the memory element 10 and an MR ratio (resistance change rate).

By using this phenomenon, by adjusting the direction of magnetization of the pinned layer 1 and the direction of magnetization of the filter layer (ferromagnetic material 5), a reading current can be accurately read without being influenced by hysterisis shown in FIG. 13 while lowering the writing current.

The memory elements shown in FIG. 1 (first embodiment), FIG. 2 (second embodiment), FIG. 3 (third embodiment) and FIG. 4 (fourth embodiment) were manufactured. Oval samples with a size of 60 to 150 nanometers were manufactured by using electron lithography and ion milling. These samples were covered by insulating films according to a lift-off method, and last, electrode films were coated on the insulating films. The samples are formed by magnetic films (ferromagnetic materials) and nonmagnetic films. The magnetic films were made of Co, and the nonmagnetic films were made of Cu.

FIG. 10 shows whether magnetization reversal occurred when 1 mA was applied to these samples. It shows a list of the cases of magnetization reversed (YES) and the cases of magnetization not-reversed (NO). In all cases, magnetization reversed when writing data, and magnetization did not reverse when reading data. The same results were obtained when CoFe or CoFeB was used as the material of the ferromagnetic materials. Therefore, the present invention is applicable regardless of the materials of the ferromagnetic materials and the nonmagnetic materials.

What is claimed is:

1. A magnetic memory including one or a plurality of storage areas having magnetoresistance effect elements, wherein each of the magnetoresistance effect elements comprises:
   a free layer;
   a pinned layer made of a ferromagnetic material;
   an intermediate nonmagnetic layer interposed between the free layer and the pinned layer;
   a writing ferromagnetic material layer which has a direction of magnetization being anti-parallel to that of the pinned layer, and is provided so that the free layer is positioned in a first current path between the writing ferromagnetic material layer and the pinned layer and a first nonmagnetic layer is positioned in the first current path between the writing ferromagnetic material layer and the free layer; and
   a reading ferromagnetic material layer which has the same direction of magnetization as that of the pinned layer, and is provided so that the free layer is positioned in a second current path between the reading ferromagnetic material layer and the pinned layer and a second nonmagnetic layer is positioned in the second current path between the reading ferromagnetic material layer and the free layer.

2. The magnetic memory according to claim 1, wherein each of the storage areas comprises:
   a writing terminal provided on one end of the first current path passing through the free layer;
   a reading terminal provided on one end of the second current path passing through the free layer; and
   a common terminal provided on the other end of the first or second current path, and in the first current path,
   the number of ferromagnetic materials belonging to a group W present between the free layer and the writing terminal and the number of ferromagnetic materials belonging to a group C present between the free layer and the common terminal are the same, and the arrangement of the directions of magnetization of the ferromagnetic materials belonging to the group W and the arrangement of the directions of magnetization of the ferromagnetic materials belonging to the group C are anti-parallel to each other when viewed from the free layer, and
   in the second current path,
   the number of ferromagnetic materials belonging to a group R present between the free layer and the reading terminal and the number of ferromagnetic materials belonging to a group C are the same, and the arrangement of the directions of magnetization of the ferromagnetic materials belonging to the group R and the arrangement of the directions of magnetization of the ferromagnetic materials belonging to the group C are the same when viewed from the free layer.

3. The magnetic memory according to claim 2, wherein ferromagnetic materials belonging to the group C are:
   the pinned layer; and
   a first ferromagnetic layer magnetized antiparallel to the pinned layer,
   the pinned layer, the first ferromagnetic layer, and a third nonmagnetic layer interposed between the first ferromagnetic layer and the pinned layer form a synthetic structure,
   ferromagnetic materials belonging to the group W are:
   the writing ferromagnetic material having a direction of magnetization being anti-parallel to that of the pinned layer; and
   a second ferromagnetic layer having a direction of magnetization being anti-parallel to that of the first ferromagnetic layer,
   a fourth nonmagnetic layer is interposed between the writing ferromagnetic material and the second ferromagnetic layer,
   ferromagnetic materials belonging to the group R are:
   the reading ferromagnetic material having the same direction of magnetization as that of the pinned layer; and
   a third ferromagnetic layer having the same direction of magnetization as that of the first ferromagnetic layer, and
   a fifth nonmagnetic layer is interposed between the reading ferromagnetic layer and the third ferromagnetic layer.

4. The magnetic memory according to claim 2, wherein each of the storage areas comprises:
   a semiconductor layer;
   an insulating layer provided on the semiconductor layer; and
   a magnetoresistance effect element provided on the insulating layer,
   the writing terminal is connected to a first bit line via a first semiconductor switch,
   the reading terminal is connected to a second bit line via a second semiconductor switch, and
   control terminals of the first and second semiconductor switches are connected to first and second control lines, respectively.

* * * * *